United States Patent [19]

Kurematsu

[11] Patent Number: 5,666,176
[45] Date of Patent: Sep. 9, 1997

[54] PROCESS FOR PRODUCING LIQUID CRYSTAL DISPLAY PANEL BY PHOTOLITHOGRAPHY USING MICROLENSES

[75] Inventor: Katsumi Kurematsu, Kawasaki, Japan

[73] Assignee: Canon Kabushiki Kaisha, Tokyo, Japan

[21] Appl. No.: 528,650

[22] Filed: Sep. 7, 1995

Related U.S. Application Data

[62] Division of Ser. No. 59,290, May 11, 1993, Pat. No. 5,473,453.

[30] Foreign Application Priority Data

May 11, 1992 [JP] Japan ............... 4-143716

[51] Int. Cl.$^6$ ............... G02F 1/1335
[52] U.S. Cl. ............... 349/95; 349/110
[58] Field of Search ............... 354/67, 62, 40, 354/41, 42; 349/57, 95, 110, 187

[56] References Cited

U.S. PATENT DOCUMENTS

| | | | |
|---|---|---|---|
| 3,744,878 | 7/1973 | Kiemle et al. | 359/40 |
| 4,790,632 | 12/1988 | Miyakawa et al. | 359/40 |
| 4,952,026 | 8/1990 | Bellman et al. | 350/1 |
| 4,981,340 | 1/1991 | Kurematsu et al. | 350/333 |
| 5,227,900 | 7/1993 | Inaba et al. | 359/56 |

FOREIGN PATENT DOCUMENTS

| | | | |
|---|---|---|---|
| 309948 | 4/1989 | European Pat. Off. | |
| 157215 | 9/1982 | Japan. | |
| 59-172627 | 9/1984 | Japan | 354/67 |
| 26213 | 2/1985 | Japan. | |
| 1816 | 1/1990 | Japan. | |
| 129268 | 4/1992 | Japan. | |

*Primary Examiner*—William L. Sikes
*Assistant Examiner*—James A. Dudek
*Attorney, Agent, or Firm*—Fitzpatrick, Cella, Harper & Scinto

[57] ABSTRACT

A photomask (5) of a liquid crystal display panel is formed by photolithographic exposure of a photosensitive resin layer through micro-lenses (3), and the apertures thereof are in complete alignment with condensed light through the micro-lenses, so that unnecessary light, such as strayed light, can be effectively masked. The liquid crystal display panel thus formed is provided with an increased effective aperture rate and suitable for a clearer image display.

4 Claims, 3 Drawing Sheets

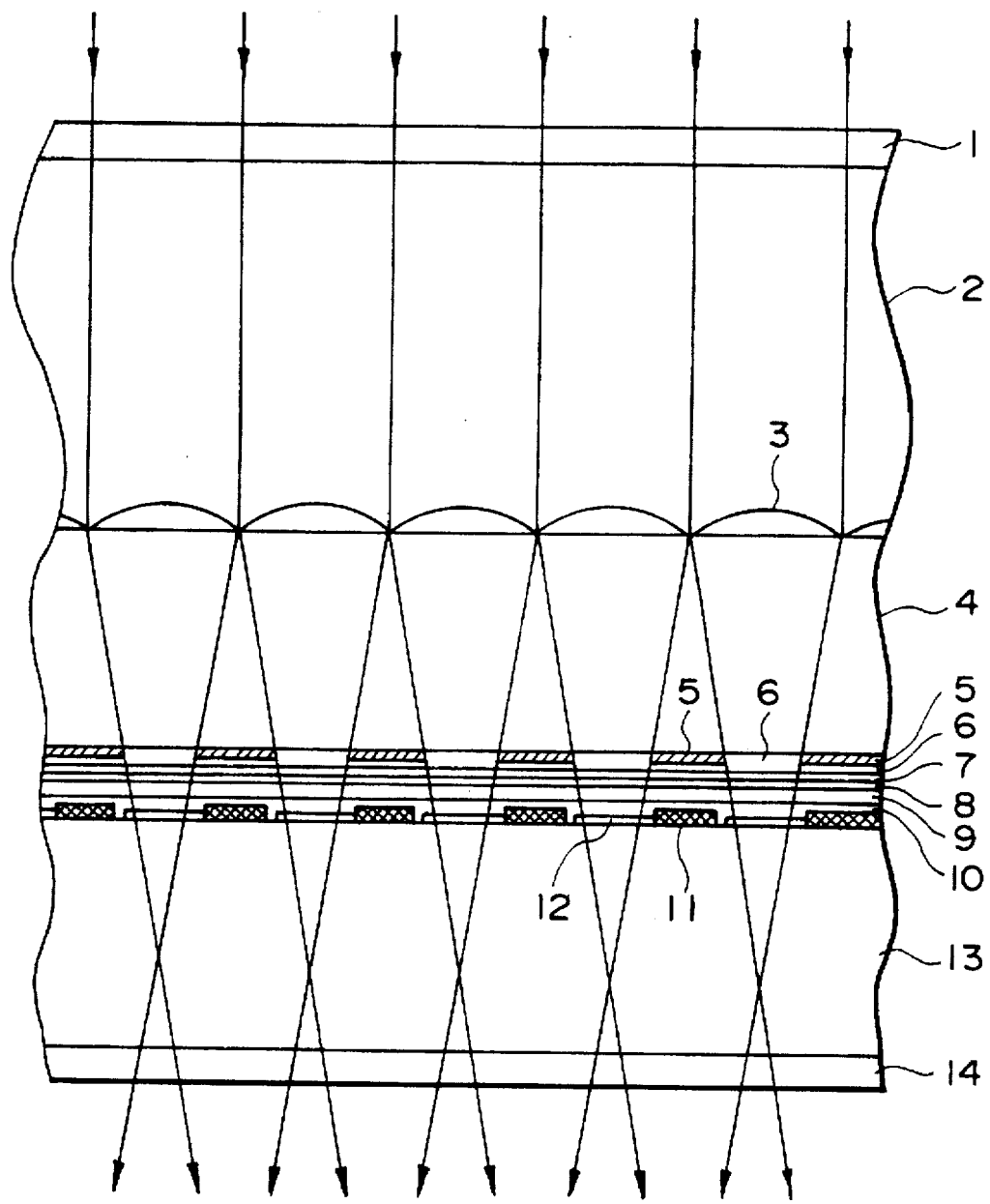
F I G. 1

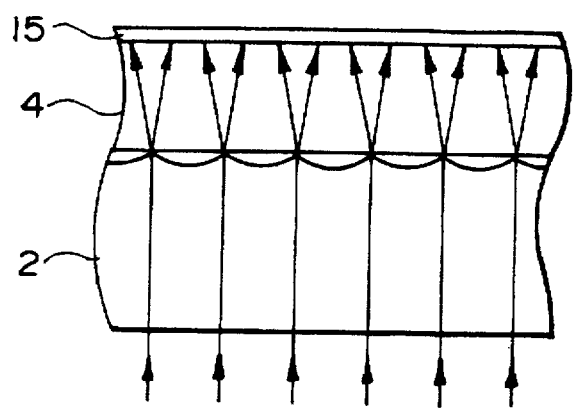
F I G. 2A
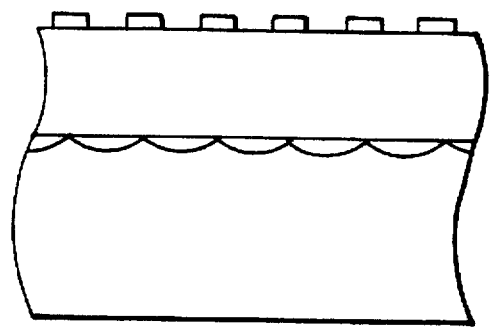
F I G. 2B
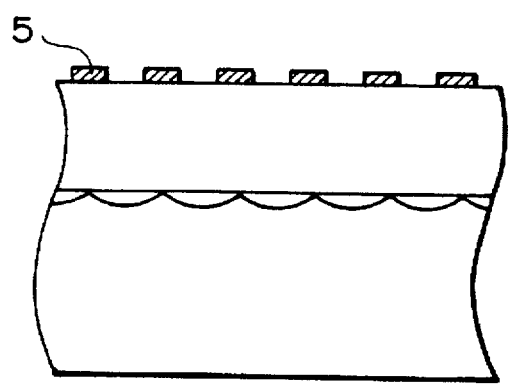
F I G. 2C

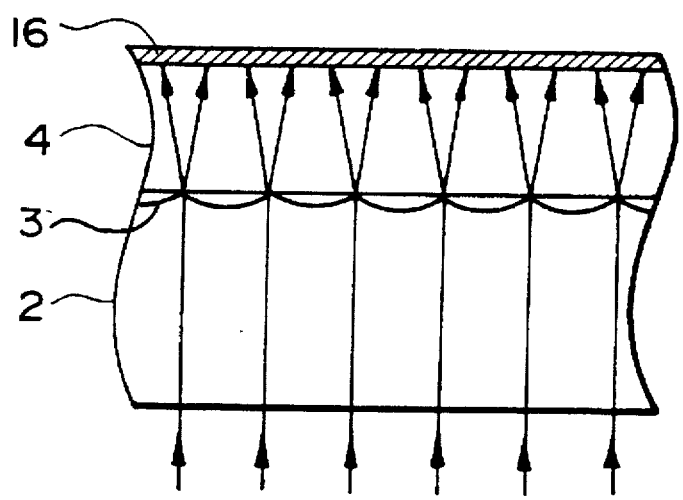
F I G. 3A
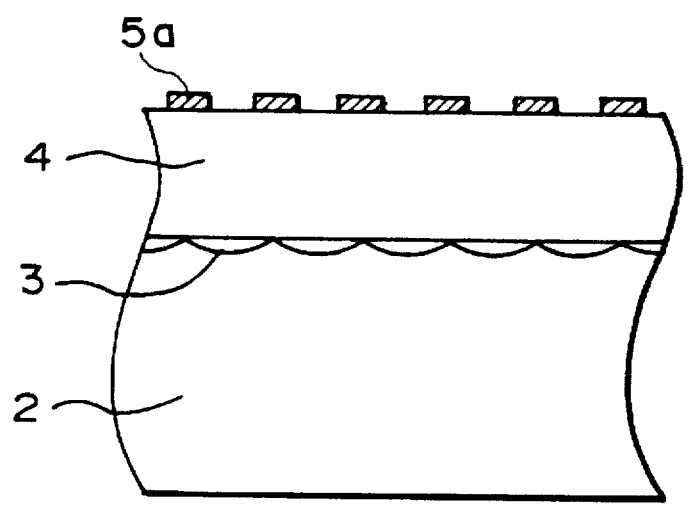
F I G. 3B

PROCESS FOR PRODUCING LIQUID CRYSTAL DISPLAY PANEL BY PHOTOLITHOGRAPHY USING MICROLENSES

This application is a division of Application Ser. No. 08/059,290, filed May 11, 1993, now U.S. Pat. No. 5,473,453.

FIELD OF THE INVENTION AND RELATED ART

The present invention relates to a liquid crystal display panel, particularly a liquid crystal display panel having an increased effective aperture rate by using micro-lenses, suitable for a liquid crystal display, a liquid crystal projector, etc.

Liquid crystal display panels using micro-lenses have been disclosed in, e.g., Japanese Laid-Open Patent Application (JP-A) 57-157215, JP-A 60-26213 and JP-A 2-1816. In each of the liquid crystal display panels, a glass substrate having micro-lenses formed thereon is applied to a liquid crystal display panel or micro-lenses are directly formed on a liquid crystal display panel.

In the conventional display panels, because of their production processes, an alignment between a photo-mask or light-interrupting mask for masking the region except for the effective pixel region and micro-lenses is required, and therefore a mask aperture designing including a tolerance for compensating for an alignment error is required so that incomplete masking of unnecessary light cannot be avoided.

SUMMARY OF THE INVENTION

In view of the above-mentioned problems of the prior art, an object of the present invention is to perform effective masking of unnecessary light.

According to the present invention, there is provided a process for producing a matrix-type liquid crystal display panel having a matrix of liquid crystal panels and an array of micro-lenses each corresponding to one or a plurality of the liquid crystal pixels, wherein a photomask is formed on the panel by photolithographic exposure through the micro-lenses.

According to another aspect of the present invention, there is provided a liquid crystal display panel, comprising: a matrix of liquid crystal pixels and an array of micro-lenses each corresponding to one or a plurality of the liquid crystal pixels, the display panel further comprising a photomask for masking a region except for the liquid crystal pixels formed by photolithographic exposure through the micro-lenses.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a partial sectional view for illustrating an embodiment of a liquid crystal display panel according to the invention.

FIGS. 2A–2C are sectional views for illustrating an embodiment of the process for producing a photomask according to the invention.

FIGS. 3A and 3B are sectional views illustrating another embodiment of the process for producing a photomask according to the invention.

DESCRIPTION OF THE PREFERRED EMBODIMENTS

In the process according to the present invention, photolithographic exposure for providing a photomask is performed through micro-lenses, so that self-alignment or automatic alignment between the photomask and the micro-lenses is effected, whereby condensed light flux obtained through the micro-lenses and the apertures of the photomask are completely aligned and the masking or interruption of unnecessary light such as strayed light is performed effectively and in a very good manner.

In the present invention, the photomask may for example be composed from a positive-type photosensitive dyed or dyeable resin or a positive-type photosensitive resin containing a pigment dispersed therein. For example, in the case where a positive-type photosensitive dyed resin, such as a novolak resin-type photoresist, the photoresist film after photolithographic exposure may be dyed, e.g., with an anthraquinone-based black dye.

The micro-lenses used in the present invention may be of any type inclusive of a graded index-type (i.e., refractive index distribution-type) or resinous lenses comprising convexities.

Hereinbelow, the present invention will be described based on some embodiments.

First embodiment

FIG. 1 is a partial sectional view of a liquid crystal display panel produced by this embodiment, and FIGS. 2A–2C are sectional views for illustrating a process for producing the photomask used therein. Referring to the figures, the liquid crystal display panel includes a counter glass substrate 4 on which a micro-lens glass substrate 2 is applied, a TFT glass substrate 13 having thin film transistors formed thereon, and a liquid crystal 9 disposed between the substrates 4 and 13. On the outer sides of the substrates are applied a pair of polarizers 1 and 14.

The production process is described below.

1) A glass substrate 4 and a glass substrate provided with graded index-type micro-lenses 3 are applied to each other, e.g., by hot pressing or using a heat-resistant adhesive.

2) The glass substrate 4 is coated by application with a positive-type photosensitive dyeable resin layer 15, which is then exposed to light through the micro-lenses 3 in a pattern corresponding to the condensation effected by the microlenses (as shown in FIG. 2A).

3) The exposed resin layer 15 is then developed to leave a pattern as shown in FIG. 2B by removing the parts exposed to the condensed light.

4) The resin pattern thus formed is dyed to form a photomask (pattern) 5 (FIG. 2C).

5) The photomask (pattern) 5 is then coated with a top-coat layer 6 of e.g., an inorganic oxide, such as silica, or a resin, such as epoxy resin, acrylic resin or polyimide (FIG. 1).

6) A counter electrode 7 of, e.g., ITO (indium tin oxide) is formed thereon, e.g., by sputtering.

7) An alignment film 8 is formed thereon, if necessary, followed by rubbing.

8) The counter substrate 4 thus formed is combined with a TFT Glass substrate 13 provided with TFTs 11, pixel electrodes 12, data electrodes, scanning electrodes and an alignment film 10 to form a cell while alignment is effected so that the photomask 5 is aligned to mask the TFTs 11.

9) The cell is filled with a liquid crystal 9 and sealed up, and then polarizers 11 and 14 are applied on the outer sides.

In the liquid crystal display panel thus produced, the micro-lenses and the photomask are self-aligned so that light fluxes condensed by micro-lenses 3 as indicated by pairs of arrows in FIG. 1 are completely aligned with the apertures of the photomask 6. As a result, the interruption or masking of unnecessary light such as strayed light can be performed effectively and in a satisfactory manner.

In the above-embodiment, the micro-lens substrate 2 is applied onto the counter glass substrate 4. It is however also possible to apply the method of the above embodiment to production of a monolithic-type substrate wherein micro-lenses are directly formed on a counter glass substrate.

Further, the micro-lenses may be formed as a two-dimensional array of dot-type lenses or an array of cylindrical lenses.

Second embodiment

FIGS. 3A and 3B illustrate another embodiment process for production of a photo-mask to be included in a liquid crystal display panel having an entire structure identical to the one shown in FIG. 1. The production process is described below.

1) A glass substrate 2 provided with graded index-type micro-lenses 3 and a glass substrate 4 are applied to each other, e.g., by hot-pressing or with a heat-resistant adhesive.

2) The glass substrate 4 is coated by application with a positive-type photosensitive resin layer 16 containing a pigment therein, and the photosensitive resin layer 16 is then exposed to light through the micro-lenses 3 in a pattern corresponding to the condensation effected by the micro-lenses (as shown in FIG. 3A).

3) The exposed resin layer 16 is then developed to leave a photomask pattern 5a as shown in FIG. 3B by removing the parts exposed to the condensed light.

4) The photomask (pattern) 5a is then coated with a top-coat layer 6 of e.g., an inorganic oxide, such as silica, or a resin, such as epoxy resin, acrylic resin or polyimide (FIG. 1).

5) A counter electrode 7 of, e.g., ITO (indium tin oxide) is formed thereon, e.g., by sputtering.

6) An alignment film 8 is formed thereon, if necessary, followed by rubbing.

7) The counter substrate 4 thus formed is combined with a TFT Glass substrate 13 provided with TFTs 11, pixel electrodes 12, data electrodes, scanning electrodes and an alignment film 10 to form a cell while alignment is effected so that the photomask 5 is aligned to mask the TFTs 11.

8) The cell is filled with a liquid crystal 9 and sealed up, and then polarizers 11 and 14 are applied on the outer sides.

In this way, a liquid crystal display panel having a structure as shown in FIG. 1 having identical effects is produced through a production process including one step less than those involved in the first embodiment.

As described above, according to the present invention, photolithographic exposure for providing a photomask is performed through micro-lenses, so that the photomask and the micro-lenses are self-aligned, whereby condensed light flux and the aperture of the photomask are completely aligned and the masking of unnecessary light is performed effectively and in a satisfactory manner.

Further, the resultant liquid crystal display panel thus produced is caused to have an increased effective aperture rate, thus providing a clear image display.

What is claimed is:

1. A process for producing a matrix-type liquid crystal display panel comprising a first substrate, a second substrate, a liquid crystal disposed between the first and second substrates so as to form a matrix of liquid crystal pixels, an array of micro-lenses formed on an outer surface of the first substrate so as to each correspond to one or a plurality of the matrix liquid crystal pixels, and a photomask disposed on an inner surface of the first substrate and comprising apertures aligned with the micro-lenses for defining said one or a plurality of the matrix liquid crystal pixels; said process comprising the steps of:

forming a layer of positive-type photosensitive resin on the inner surface of the first substrate, exposing the positive-type photosensitive resin layer to light incident through the micro-lenses, and developing the exposed photosensitive resin layer to form said photomask having apertures at exposed parts of the photosensitive resin layer on the first substrate.

2. A process according to claim 1, wherein said layer of positive-type photosensitive resin contains a pigment dispersed therein.

3. A process according to claim 1, further including a step of forming thin film transistors on the second substrate.

4. A process according to claim 1, further including a step of dyeing the exposed and developed photosensitive resin layer.

* * * * *